US011532609B2

(12) United States Patent
Appaswamy et al.

(10) Patent No.: US 11,532,609 B2
(45) Date of Patent: *Dec. 20, 2022

(54) ESD DEVICE WITH FAST RESPONSE AND HIGH TRANSIENT CURRENT

(71) Applicant: Texas Instruments Incorporated, Dallas, TX (US)

(72) Inventors: Aravind C. Appaswamy, Plano, TX (US); James P. Di Sarro, Allen, TX (US)

(73) Assignee: TEXAS INSTRUMENTS INCORPORATE, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,185

(22) Filed: Dec. 7, 2020

(65) Prior Publication Data

US 2021/0091068 A1 Mar. 25, 2021

Related U.S. Application Data

(62) Division of application No. 15/670,148, filed on Aug. 7, 2017, now Pat. No. 10,861,844.

(51) Int. Cl.
*H01L 27/02* (2006.01)
*H02H 9/02* (2006.01)
*H01L 23/60* (2006.01)
*H02H 9/04* (2006.01)

(52) U.S. Cl.
CPC .......... *H01L 27/0259* (2013.01); *H01L 23/60* (2013.01); *H02H 9/025* (2013.01); *H02H 9/046* (2013.01)

(58) Field of Classification Search
CPC .... H02H 9/025; H02H 9/046; H01L 27/0259; H01L 23/60
USPC ......................................................... 361/56
See application file for complete search history.

(56) References Cited

U.S. PATENT DOCUMENTS

| 6,614,077 | B2  | 9/2003 | Nakamura et al. |
| 6,900,091 | B2  | 5/2005 | Williams et al. |
| 7,719,813 | B2* | 5/2010 | Chen ...................... H02H 9/046 361/111 |

(Continued)

OTHER PUBLICATIONS

Christian C. Russ, et al., "GGSCRs: GGNMOS Triggered Silicon Controlled Rectifiers for ESD Protection in Deep Sub-Micron CMOS Processes," Electrical Overstress/Electrostatic Discharge Symposium, Sep. 11-13, 2001, 10 pages.

*Primary Examiner* — Kevin J Comber
(74) *Attorney, Agent, or Firm* — Michael A. Davis, Jr.; Frank D. Cimino

(57) ABSTRACT

An electrostatic discharge (ESD) device with fast response to high transient currents. The ESD device includes a short-pulse discharge (SPD) path and a long-pulse discharge (LPD) path. The SPD path provides robust response to ESD events, and it triggers a self-bias configuration of the LPD path. Advantageously, the SPD path reduces the risk of ESD voltage overshoot by promptly discharging short-pulse currents, such as a charge device model (CDM) current, whereas the LPD path provides efficient discharge of long-pulse currents, such as a human body model (HBM) current. In one implementation, for example, the SPD path includes a MOS transistor, and the LPD includes a bipolar transistor having a base coupled to the source of the MOS transistor.

19 Claims, 3 Drawing Sheets

(56) References Cited

U.S. PATENT DOCUMENTS

| | | | |
|---|---|---|---|
| 8,077,440 B2 * | 12/2011 | Krabbenborg | H01L 27/0285 361/111 |
| 8,569,836 B2 * | 10/2013 | Lee | H01L 27/0277 257/362 |
| 2014/0210007 A1 | 7/2014 | Deval et al. | |
| 2014/0252470 A1 | 9/2014 | Chen et al. | |

* cited by examiner

ESD DEVICE WITH FAST RESPONSE AND HIGH TRANSIENT CURRENT

CROSS-REFERENCE TO RELATED APPLICATION

This application is a divisional of U.S. patent application Ser. No. 15/670,148 filed Aug. 7, 2017, which is incorporated herein by reference.

BACKGROUND

During an electrostatic discharge (ESD) event, an electrical circuit may receive a large amount of electrical charges in a relatively short period of time via one or more I/O terminals. The transient accumulation of these ESD charges may cause damage to various components of the electrical circuit if these ESD charges are not dissipated properly. To minimize these damages, ESD devices are used for protecting electrical circuits from ESD events. An ESD device may include transistors with large sizes to handle a large amount of ESD current. However, large transistors impose area penalty on an integrated circuit, and they typically have non-uniform triggering behaviors, which may impact the performance of the ESD device as well.

SUMMARY

This description describes apparatus and techniques relating to the manufactures and operations of electrostatic discharge (ESD) devices with fast response to high transient currents. The described ESD device includes a short-pulse discharge (SPD) path and a long-pulse discharge (LPD) path. The SPD path provides robust response to ESD events, and it triggers a self-bias configuration of the LPD path. Advantageously, the SPD path reduces the risk of ESD voltage overshoot by promptly discharging short-pulse currents, such as a charge device model (CDM) current, whereas the LPD path provides efficient discharge of long-pulse currents, such as a human body model (HBM) current. In one implementation, for example, the SPD path includes a MOS transistor, and the LPD includes a bipolar transistor having a base coupled to the source of the MOS transistor.

DETAILED DESCRIPTION OF EXAMPLE EMBODIMENTS

Like reference symbols in the various drawings indicate like elements. The drawings are not necessarily drawn to scale.

Figure 1:
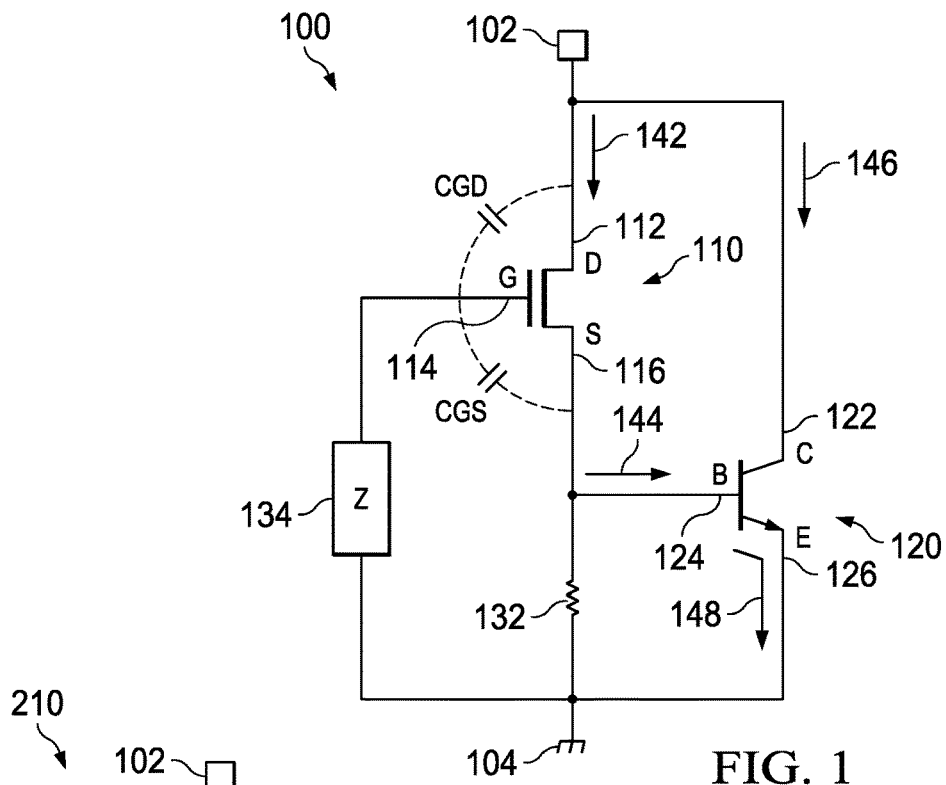
FIG. 1 shows a schematic view of an electrostatic discharge (ESD) device according to an aspect of this description.

FIG. 1 shows a schematic view of an electrostatic discharge (ESD) device 100 according to an aspect of this description. The ESD device 100 is used for protecting an electronic component or an electrical circuit from ESD events. To that end, the ESD device 100 may be implemented within an integrated circuit for protecting the circuit components therein. Alternatively, the ESD device 100 may be realized as a standalone device that is connected to a component or a circuit to be protected.

The ESD device 100 includes an input/output (I/O) terminal 102, or I/O pad, for receiving an input signal or delivering an output signal. In certain configurations, the I/O terminal 102 may be used for receiving a supply voltage (e.g., VDD or VCC) as well. The ESD device 100 also includes a ground terminal 104 for discharging ESD currents. Between the I/O terminal 102 and the ground terminal 104, the ESD device 100 provides a pair of parallel, yet interactive, discharge paths. The first discharge path is used for discharging short-pulse currents, such as charge device model (CDM) currents, whereas the second discharge path is used for discharging long-pulse currents, such as human body model (HBM) currents. In general, a short-pulse current may have an amplitude of about 10 A or greater and a duration of about 1 ns, whereas a long-pulse current may have an amplitude of about 1 A to 2 A and a duration of about 150 ns. As described herein, the first discharge path may be referred to as a short-pulse discharge (SPD) path, and the second discharge path may be referred to as a long-pulse discharge (LPD) path.

For fast response time, the SDP path includes a metal-oxide semiconductor (MOS) transistor 110 to initiate the conduction of a short-pulse current 142. The MOS transistor 110 includes a drain terminal 112, a gate terminal 114, and a source terminal 116. The drain terminal 112 is coupled to the I/O terminal 102. The gate terminal 114 is coupled to an impedance component 134, which is coupled to the ground terminal 104. The source terminal 116 is coupled in series with a resistor 132, which is also coupled to the ground terminal 104.

The SPD path is configured to trigger a portion of a bipolar transistor (BJT) 120, which can be an NPN bipolar transistor. The BJT 120 includes a collector terminal 122, a base terminal 124, and an emitter terminal 126. The collector terminal 122 is coupled to the I/O terminal 102, the base terminal 124 is coupled to the source terminal 116 of the MOS transistor 110, and the emitter terminal 126 is coupled to the ground terminal 104. The PN junction between the base terminal 124 and the emitter terminal 126 is triggered by the SPD path during an initial discharge of the ESD current.

The LPD path includes the BJT 120, which is in operation after the voltage $V_{BE}$ between the base terminal 124 and the emitter terminal 126 is triggered by the MOS transistor 110 and then reaches a self-biased level. When the voltage $V_{BE}$ is self-biased at a certain value, the collector terminal 122 and the emitter terminal 126 will be responsible for conducting the long-pulse current. The current load of the LDP path may be alleviated by the MOS transistor 110. After the initial short-pulse current is conducted, the gate terminal 114 of the MOS transistor 110 may be self-biased at or above a certain threshold to sustain a small amount of long-pulse current through the resistor 132.

The MOS transistor 110 may be an N-type MOS (NMOS) transistor fabricated from a complementary MOS (CMOS) process. To withstand a large drain-to-source voltage, the MOS transistor 110 may include an extended drain. In that configuration, the MOS transistor 110 may be an N-type drain-extended MOS (DEMOS or EDMOS) transistor. Where the source region and the body region of the DEMOS transistor has a lateral channel with its body and source regions are doubled diffused, the MOS transistor 110 can be an LDMOS transistor. Alternatively, where the source region and the body region of the DEMOS transistor has a vertical channel with its body and source regions doubled diffused, the MOS transistor 110 can be a VDMOS transistor.

At the onset of an ESD event, the parasitic capacitance $C_{GD}$ between the drain terminal 112 and the gate terminal 114 of the MOS transistor 110 allows the drain voltage to bootstrap the gate voltage, thereby increasing a gate-to-source voltage $V_{GS}$ between the gate terminal 114 and the source terminal 116. When the gate-to-source voltage $V_{GS}$ reaches or exceeds a threshold voltage of the MOS transistor 110, the MOS transistor 110 will conduct a first current 142, which can be a short-pulse current as described above. Then, the potential of the source terminal 116 rises quickly due in part to the bootstrapping provided by the parasitic capacitance $C_{GS}$ between the gate terminal 114 and the source terminal 116, and due in part to the first current 142 conducted via the resistor 132 to the ground terminal 104.

The quick rise of the source potential generates a self-bias trigger 144, which propagates to the base terminal 124 of the BJT 120. The self-bias trigger 144 in turn actuates a forward bias across a PN junction between the base terminal 124 and the emitter terminal 126. This PN junction (i.e., the base-to-emitter junction) then starts to conduct a second current 148. The second current 148 may divert a substantial amount of the first current 142. Advantageously, the base-emitter junction of the BJT 120 provides an additional current path to alleviate the current load of the MOS transistor 110 and the resistor 132 for draining the short-pulse current. Turning on the base-emitter junction of the bipolar transistor 120 speeds up the response of the bipolar transistor 120, thereby turning on the current path 146. The fast transient current event is now shared between the current paths (e.g., 142+148 and 146). In addition, the MOS transistor 110 has a fast parasitic bipolar transistor between its drain and source terminals 112 and 116, which turns on when the voltage rises with the high currents associated with the transient event. This further enhances the current sharing between the bipolar transistor and the MOS transistor paths (e.g., 142+148 and 146)

The quick triggering of the PN junction between the base terminal 124 and the emitter terminal 126 substantially reduces the discharge time of the short-pulse current, which in turn reduces a peak transient voltage across the I/O terminal 102 and the ground terminal 104. When compared to a configuration in which an NPN transistor and a MOS transistor are arranged in parallel but without the source-to-base coupling, the present configuration provides two times the current conducting capability during an early stage of an ESD event. Advantageously, the SPD path of the ESD device 100 delivers robust performance against short-pulse currents by combining the high response speed of the MOS transistor 110 with the fast base-emitter junction of the BJT 120.

In a slower event like HBM, the same mechanism helps turn-on the bipolar junction transistor but in general, the third current 146 constitutes a majority of the long-pulse current. And during this time, the MOS transistor 110 will continue to conduct the first current 142 as well, which is a small portion of the long-pulse current. When compared to a configuration in which an NPN transistor is coupled to a PNP transistor to form a silicon-controlled rectifier (SCR), the present configuration allows the collector terminal 122 to be coupled directly to the I/O terminal 102. Advantageously, the LPD path of the ESD device 100 delivers robust performance against long-pulse currents by increasing the current capacity from the state of the art.

As described above, the gate terminal 114 of the MOS transistor 110 is coupled with the ground terminal 104 via the impedance component 134. Depending on a particular implementation, the impedance component 134 can be realized in multiple ways. For example, FIGS. 2A-2C show the schematic views of several implementations of the ESD device 100 according to several aspects of this description.

Figure 2A:
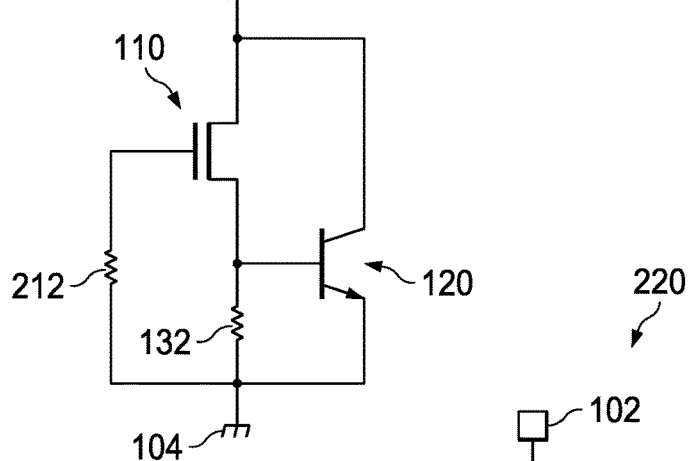
FIGS. 2A-2C show the schematic views of several implementations of the ESD device according to several aspects of this description.

In FIG. 2A, the ESD device 210 has substantially the same circuit configuration as the ESD device 100 except that the impedance component 134 is realized by a second resistor 212. More specifically, the gate terminal 114 of the MOS transistor 110 is coupled to the second resistor 212, which is coupled to the ground terminal 104 in parallel with the resistor 132. This configuration allows for an independent control of the RC time constant of the MOS transistor 110 since the gate resistor 212 is not coupled to the base-emitter resistor 132. The gate resistor 212 can therefore be designed so that the MOS transistor 110 either does not turn on strongly or switches off quickly during slow and long transient events thereby forcing the long even currents to flow through the current path 146.

Figure 2B:
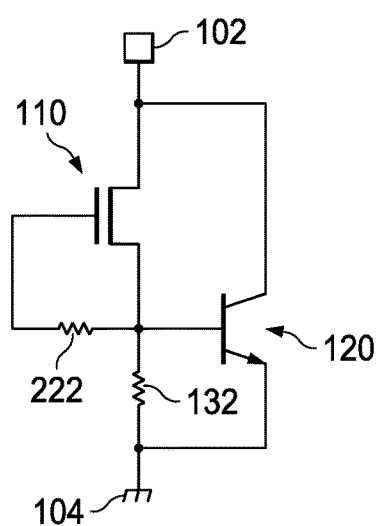

In FIG. 2B, the ESD device 220 has substantially the same circuit configuration as the ESD device 100 except that the impedance component 134 is realized by a second resistor 222 in combination with the resistor 132. More specifically, the gate terminal 114 of the MOS transistor 110 is coupled in series with the second resistor 222 and to the source terminal 116. In turn, the second resistor 222 is coupled in series with the resistor 132 and to the ground terminal 104. This configuration can be used to tune the RC time constant on the MOS transistor 110 between the boundaries determined by its gate to source capacitance multiplied by the total of resistances 132 and 222, or alternatively, just the resistor 222 (in situations where the bipolar transistor is fully turned on)

Figure 2C:
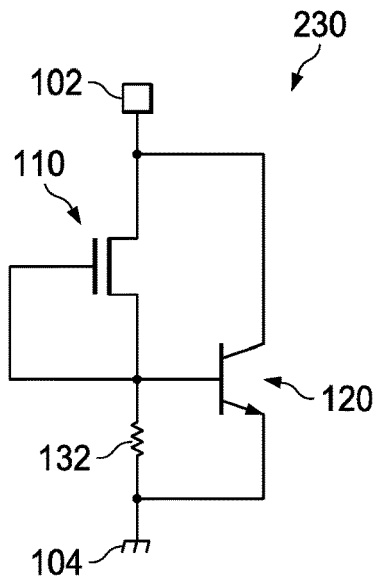

In FIG. 2C, the ESD device 230 has substantially the same circuit configuration as the ESD device 100 except that the impedance component 134 is realized by the resistor 132. More specifically, the gate terminal 114 of the MOS transistor 110 is coupled to the source terminal 116, which is coupled to the ground terminal 104 via the resistor 132. This configuration provides the best protection for the MOS transistor 110 from a long and slow event since its safe operating area is maximized under these circumstances. In the event of a fast transient event, the parasitic bipolar transistor between its drain and source terminals 112 and 116 can still turn on, thereby providing the current path 144 to turn on the bipolar transistor 120.

Figure 3:
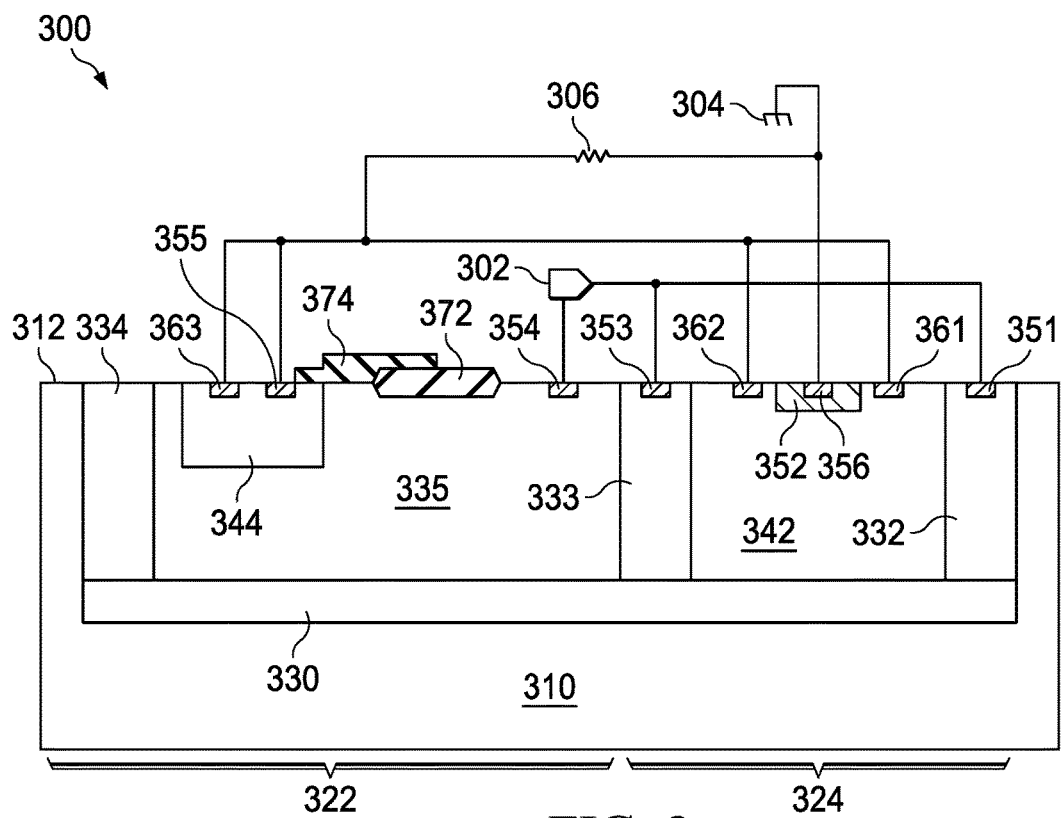
FIG. 3 shows a cross-sectional view of an ESD device according to an aspect of this description.

The circuitry of the ESD device 100 can be integrated into a single semiconductor structure to improve the overall size efficiency of an integrated circuit. For example, FIG. 3 shows a cross-sectional view of an ESD device 300 according to an aspect of this description. The ESD device 300 provides an integrated solution to realize the circuit configuration of the ESD device 100. In particular, the ESD device 300 includes an LDMOS structure 322 for implementing the MOS transistor 110, and an NPN structure 324 for implementing the BJT 120.

The ESD device 300 can be formed on and within a semiconductor substrate 310 having a surface 312. Where the ESD device 300 is oriented according to FIG. 3, the surface 312 may be referred to as a top surface. Alternatively, where the ESD device 300 is inverted upside down from the configuration of FIG. 3, the surface 312 may be referred to as a bottom surface. The substrate 310 may be a p-type substrate with a relatively low dopant concentration (e.g., $10^{15}$-$10^{16}$ cm$^{-3}$). In one implementation, the substrate 310 may be a bulk substrate. In another implementation, the substrate 310 may include a bulk substrate having one or more epitaxial layers grown thereon.

The ESD device 300 includes an n-doped buried layer 330, which can be formed during an epitaxial growth or by deep implanting a doped region in the substrate 310. The n-doped buried layer 330 is buried under the top surface 312 from about 2 μm to about 4 The n-doped buried layer 330 supports one or more doped regions and/or layers. For instance, multiple n-doped regions (e.g., 332-335) extend from the top surface 312 to reach, and be supported by, the n-doped buried layer 330. Likewise, a p-doped region 342 extends from the top surface 312 to reach, and be supported by, the n-doped buried layer 330.

Together with the n-doped buried layer 330, the vertical n-doped regions 332 and 334 form an isolation well structure for electrically isolating the operations of the LDMOS structure 330 and the NPN structure 324. The LDMOS structure 330 includes a drain terminal, an extended drain (or drain drift) region, a source terminal, and a body region. The drain terminal is implemented by the n-doped region 354. The extended drain (or drain drift) region is implemented by the n-doped region 335. The extended drain region 335 extends from the drain terminal 354, and the drain terminal 354 is positioned within the extended drain region 335. Collectively, the drain terminal 354 and the extended drain region 335 form an n-doped drain region. The source terminal is implemented by an n-doped region 355, which is within the body region implemented by p-doped region 344 having a body terminal region 363. The source terminal 355 is separated and segregated from the drain terminal 354 by the body region 344 and the extended drain region 335.

To control the conductivity of a channel in the LDMOS structure 322, a gate structure 374 is positioned over and across the n-doped extended drain region 335 and the p-doped body region 344. An isolation structure 372, such as an shallow trench isolation (STI) structure, can be formed along the top surface 312 and above the n-doped extended drain region 335. In one implementation, the isolation structure 372 includes a dielectric material such as silicon oxide, and it can be positioned between the drain terminal 354 and the gate structure 374.

The NPN structure 324 includes a collector terminal, a base terminal, and an emitter terminal. The collector terminal is implemented in n-doped regions 351 and/or 353. The collector terminal is within and extended by the vertical n-doped regions 332 and 333, which are coupled to the n-doped layer 330. Collectively, the n-doped regions 351, 353, 332, 333, and 330 form the collector region of the NPN structure 324. The base terminal is implemented by p-doped regions 362 and 361. The base terminal is within and extended by a p-doped region 342. Collectively, the p-doped regions 362 and 342 form the base region of the NPN structure 324. The base region is supported and laterally surrounded by the collector region (e.g., 332, 333, and 330). The emitter terminal is implemented by an n-doped region 356. In one implementation, the emitter terminal may form a standalone emitter region without any extended doped region. In another implementation, the emitter terminal may be surrounded extended by an n-doped region 352 to form an emitter region. In either case, the n-doped emitter region is positioned within the base region (e.g., 342).

The n-doped regions 351-355 and the p-doped regions 361-363 are contact regions, which typically have a higher dopant concentration than their extended doped regions. Moreover, the vertical n-doped regions 332-334 may have a lower dopant concentration than the contact doped regions but a higher dopant concentration than the drain-extended region 335 and the base region 342. For example, the n-doped contact regions 351-355 may each have a dopant concentration ranges from about $5\times10^{19}$ cm$^{-3}$ to about $5\times10^{20}$ cm$^{-3}$, whereas the p-doped contact regions 361-363 may each have a dopant concentration ranges from about $5\times10^{19}$ cm$^{-3}$ to about $5\times10^{20}$ cm$^{-3}$. The vertical n-doped regions 332-334 may each have a dopant concentration ranges from about $1\times10^{18}$ cm$^{-3}$ to about $5\times10^{19}$ cm$^{-3}$. The n-doped drain-extended region 335 may have a dopant concentration ranges from about $5\times10^{15}$ cm$^{-3}$ to about $1\times10^{17}$ cm$^{-3}$, and the n-doped emitter region 352 may have a dopant concentration ranges from about $5\times10^{18}$ cm$^{-3}$ to about $5\times10^{20}$ cm$^{-3}$. The p-doped body region 344 may have a dopant concentration ranges from about $1\times10^{17}$ cm$^{-3}$ to about $5\times10^{18}$ cm$^{-3}$, and the p-doped base region 342 may have a dopant concentration ranges from about $1\times10^{17}$ cm$^{-3}$ to about $5\times10^{18}$ cm$^{-3}$.

The ESD device 300 implements the circuit connectivity as demonstrated by the ESD device 100 in FIG. 1. The drain terminal 354 of the LDMOS structure 322 and the collector terminals 351 and 353 of the NPN structure 324 are coupled to an I/O terminal 302. The I/O terminal 302 may be implemented by a bond pad positioned above the top surface 312. The coupling among the drain terminal 354, the collector terminals 351 and 353, and the I/O terminal 302 is implemented by a conductor, which may include one or more layers of metal (e.g., copper, aluminum, and/or tungsten) above the top surface 312 and insulated by a dielectric material.

The source terminal 355 and the body terminal 363 of the LDMOS structure 322 are coupled to each other and to the base terminals 361 and/or 362 of the NPN structure 324. The coupling between the source terminal 355 and the base terminals 362 and/or 361 allows the rapid response of the LDMOS structure 322 to trigger a fast discharge path under a forward bias of the base-emitter PN junction of the NPN structure 324. Advantageously, the ESD device 300 realizes a compact structure in which the source terminal 355 is positioned within a proximity (e.g., less the 10 μm) of the base terminals 361 and/or 362. Within this proximity, the self-trigger bias 144 as described in FIG. 1 can be actuated in a robust yet area-efficient manner.

The coupling among the source terminal 355, the body terminal 363, and the base terminals 361 and 362 is implemented by a conductor, which may include one or more layers of metal (e.g., copper, aluminum, and/or tungsten) above the top surface 312 and insulated by a dielectric material. Consistent with the circuitry as shown in FIG. 1, this source-to-base node is further coupled in series with a resistor 306, which is in turn coupled to a ground terminal 304. The resistor 306 may be a polysilicon resistor formed with the same material as the gate structure 374. Alternatively, the resistor 306 may be a sheet resistor formed within a doped region, such as doped region 354 or 363. Likewise, the emitter terminal 356 of the NPN structure 324 is coupled to the ground terminal 304. Similar to the I/O terminal 302, the ground terminal 304 may also be implemented by a bond pad.

Figure 4:
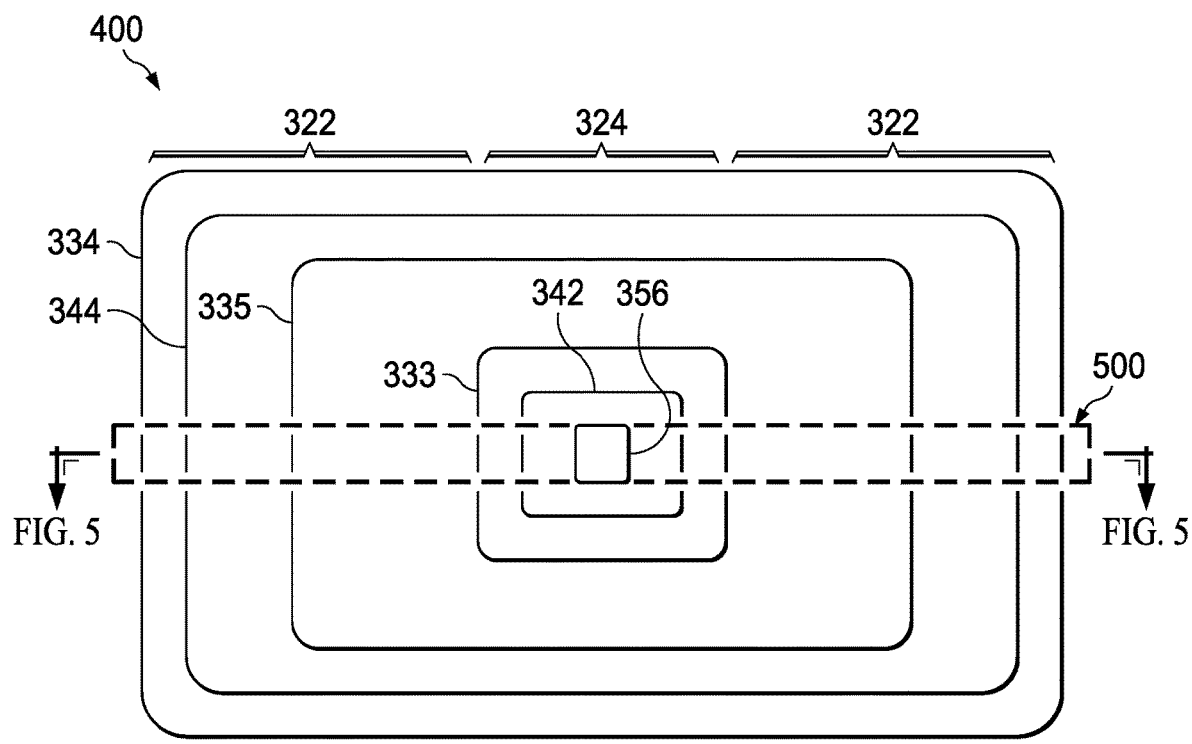
FIG. 4 shows a top view of a symmetrical ESD device according to an aspect of this description.
Figure 5:
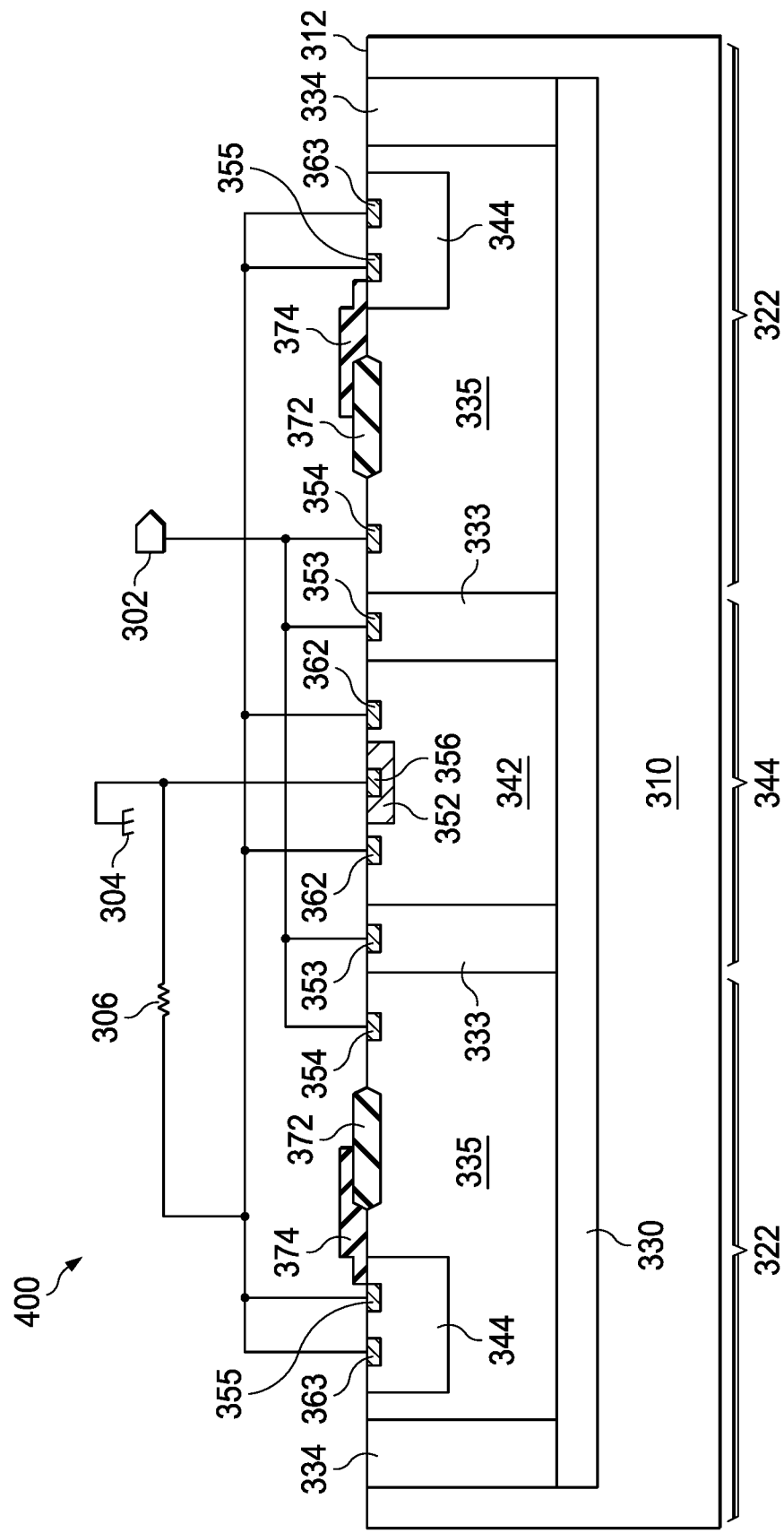
FIG. 5 shows a cross-sectional view of the symmetrical ESD device according to an aspect of this description.

The ESD device 300 is shown to be asymmetrical for the sake of simpler illustrations. In practice, the ESD device 300 may have more uniform and robust performance if it is configured into a symmetrical device. For example, FIG. 4 shows a top view of a symmetrical ESD device 400 with a cross-sectional view shown in FIG. 5 for reference. The ESD device 400 adopts a race-track configuration for positioning various doped regions. In one implementation, the n-doped emitter region, which includes the emitter contact region 356 and potentially the extended region 352, is positioned at the center of a race-track configuration. The p-doped base region 342 laterally circumscribes the n-doped emitter region 356 to form the fast-triggered PN junction as described above. The n-doped collector region 333 laterally circumscribes the p-doped base region 342 to complete the NPN structure 324. The n-doped collector region 333 also serves to interface with the drain region of the LDMOS structure 322, which laterally circumscribes the NPN structure 324.

The n-doped drain-extended region 335 of the LDMOS structure 322 laterally circumscribes the n-doped collector region 333. The p-doped body region 344 is positioned along an outer track within the n-doped drain-extended region 335. Alternatively, the p-doped body region 344 may laterally circumscribe the n-doped drain-extended region 335. The n-doped isolation structure 334 laterally circumscribes the LDMOS structure 322 to electrically isolate the operations of the symmetrical ESD device 400.

Besides the race-track configuration, the symmetrical ESD device 400 may adopt a linear configuration 500 with the emitter region 356 taking the center position. Like the race-track configuration, the linear configuration 500 arranges the NPN structure 324 closer to the center and the LDMOS structure 322 closer to the perimeter. The p-doped base region 342 laterally surrounds the n-doped emitter region 356 to form the fast-triggered PN junction as described above. The n-doped collector region 333 laterally surrounds the p-doped base region 342 to complete the NPN structure 324. The n-doped collector region 333 also serves to interface with the drain region of the LDMOS structure 322, which laterally surrounds the NPN structure 324.

The n-doped drain-extended region 335 of the LDMOS structure 322 laterally surrounds the n-doped collector region 333. The p-doped body region 344 is positioned along an outer perimeter within the n-doped drain-extended region 335. Alternatively, the p-doped body region 344 may laterally surrounds the n-doped drain-extended region 335. The n-doped isolation structure 334 laterally surrounds the LDMOS structure 322 to electrically isolate the operations of the linearly configured symmetrical ESD device 500.

Although this description describes ESD devices discharging via a ground terminal with N-type transistors (e.g., NMOS transistor, N-type LDMOS transistor, and NPN transistor), various aspects of this description may also apply to ESD devices discharging via a voltage supply terminal with P-type transistors (e.g., PMOS transistor, P-type LDMOS transistor, and PNP transistor). For instance, the teachings of this description may be applied to an ESD device coupled between a voltage supply terminal (e.g., VDD or VCC) and the I/O terminal 102. The ESD device may include a PMOS transistor having a complementary configuration of the NMOS transistor 110, and a PNP transistor having a complementary configuration of the NPN transistor 120. The p-type source terminal of the PMOS transistor is coupled to the n-type base terminal of the PNP transistor for initiating a self-bias trigger in a manner that is complimentary to the above description. In this configuration, the emitter of the PNP bipolar transistor will be connected to the supply terminal and the collector connects to the I/O pad.

Consistent with this description, the term "configured to" purports to describe the structural and functional characteristics of one or more tangible non-transitory components.

For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

In particular regard to the various functions performed by the above-described components (such as elements, resources, etc.), the terms used to describe such components correspond, unless otherwise indicated, to any component which performs the specified function of the described component (e.g., that is functionally equivalent), even though not structurally equivalent to the described structure.

Furthermore, terms of relativity, such as "about," "approximately," "substantially," "near," "within a proximity," "sufficient . . . to," "maximum," and "minimum," as applied to features of an integrated circuit and/or a semiconductor device can be understood with respect to the fabrication tolerances of a particular process for fabricating the integrated circuit and/or the semiconductor device. Also, these terms of relativity can be understood within a framework for performing one or more functions by the integrated circuit and/or the semiconductor device.

More specifically, for example, the terms "substantially the same," "substantially equals," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

Operations are depicted in the drawings in a particular order, but such operations are not required to be performed in the particular order shown nor in sequential order, and not all illustrated operations are required to be performed, to achieve desirable results unless such order is recited in one or more claims. In certain circumstances, multitasking and parallel processing may be advantageous. Moreover, the separation of various system components in the embodiments described above does not require such separation in all embodiments.

Modifications are possible in the described embodiments, and other embodiments are possible, within the scope of the claims.

What is claimed is:

1. An electrostatic discharge (ESD) protection device, comprising:
    a lateral diffused MOS (LDMOS) transistor including:
        a first n-doped region including an n-doped drain terminal coupled to an I/O terminal;
        an n-doped source terminal positioned within a p-doped region, in which the p-doped region is positioned within the first n-doped region;
        a gate over and across the first n-doped region and the second p-doped region; and
        a resistor coupled between the n-doped source terminal and a ground terminal;
    an NPN bipolar transistor including:
        a second n-doped region inlcuding an n-doped collector coupled to the I/O terminal;
        a p-doped base terminal coupled to the n-doped source terminal of the LDMOS transistor; and
        a third n-doped region including an n-doped emitter terminal coupled to the ground terminal.

2. The ESD protection device of claim 1, wherein the gate of the LDMOS transistor is coupled to the n-doped source terminal of the LDMOS transistor.

3. The ESD protection device of claim 1, wherein the second n-doped region is adjacent the first n-doped region.

4. The ESD protection device of claim 1, further comprising an n-doped buried layer under the first and second n-doped regions.

5. The ESD protection device of claim 4, wherein the second n-doped region is a vertical n-doped region coupled to the n-doped buried layer.

6. The ESD protection device of claim 5, wherein the first n-doped region is coupled to the n-doped buried layer.

7. The ESD protection device of claim 1, wherein the p-doped region is a first p-doped region, and the ESD protection device further comprises a second p-doped region including the p-doped base terminal of the LDMOS transistor.

8. The ESD protection device of claim 7, wherein the third n-doped region is positioned within the second p-doped region.

9. The ESD protection device of claim 7, wherein the second p-doped region is adjacent the second n-doped region.

10. The ESD protection device of claim 7, wherein the second n-doped region laterally circumscribes the second p-doped region.

11. The ESD protection device of claim 10, wherein the first n-doped region laterally circumscribes the second n-doped region.

12. The ESD protection device of claim 1, wherein the p-doped region includes a p-doped body terminal coupled to the n-doped source terminal.

13. The ESD protection device of claim 1, further comprising a substrate in which the LDMOS transistor and the NPN bipolar transistor are formed.

14. The ESD protection device of claim 1, wherein the p-doped region is a first p-doped region, and the ESD protection device further comprises a second p-doped region including the p-doped base terminal, in which the third n-doped region is positioned within the second p-doped region, the second n-doped region laterally circumscribes the second p-doped region, and the first n-doped region laterally circumscribes the second n-doped region.

15. The ESD protection device of claim 14, wherein the gate of the LDMOS transistor is coupled to the n-doped source terminal of the LDMOS transistor.

16. The ESD protection device of claim 14, wherein the first p-doped region includes a p-doped body terminal coupled to the n-doped source terminal of the LDMOS transistor.

17. The ESD protection device of claim 1, further comprising:
    an n-doped buried layer under the first and second n-doped regions; and
    a substrate under the n-doped buried layer.

18. The ESD protection device of claim 17, wherein the second n-doped region is a vertical n-doped region coupled to the n-doped buried layer.

19. The ESD protection device of claim 18, wherein the first n-doped region is coupled to the n-doped buried layer.

* * * * *